(12) United States Patent
Kornilovich et al.

(10) Patent No.: US 7,374,968 B2
(45) Date of Patent: May 20, 2008

(54) METHOD OF UTILIZING A CONTACT PRINTING STAMP

(75) Inventors: Pavel Kornilovich, Corvallis, OR (US); Peter Mardilovich, Corvallis, OR (US); Kevin F Peters, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 304 days.

(21) Appl. No.: 11/046,107

(22) Filed: Jan. 28, 2005

(65) Prior Publication Data

US 2006/0185540 A1    Aug. 24, 2006

(51) Int. Cl.
*H01L 21/00* (2006.01)
(52) U.S. Cl. ...................... 438/110; 428/377
(58) Field of Classification Search ............... 257/622, 257/443; 438/110, 489, 377
See application file for complete search history.

(56) References Cited

U.S. PATENT DOCUMENTS

| 5,512,131 | A | * | 4/1996 | Kumar et al. ............ 438/738 |
| 6,060,121 | A | | 5/2000 | Hidber |
| 6,365,059 | B1 | | 4/2002 | Pechenik |
| 6,407,443 | B2 | | 6/2002 | Chen |
| 6,518,194 | B2 | | 2/2003 | Winningham |
| 6,547,940 | B2 | | 4/2003 | Aksay |
| 6,599,824 | B1 | | 7/2003 | Krivokapic |
| 6,709,929 | B2 | | 3/2004 | Zhang |
| 6,755,984 | B2 | | 6/2004 | Lee |
| 6,764,833 | B1 | | 7/2004 | Yeatman |
| 7,060,625 | B2 | * | 6/2006 | Lee ............................ 438/702 |
| 2003/0213382 | A1 | | 11/2003 | Kendale |
| 2004/0163758 | A1 | | 8/2004 | Kagan |

FOREIGN PATENT DOCUMENTS

WO    WO 2004/012234    2/2004

OTHER PUBLICATIONS

Chappell Brown; "Nanowire array manufacturing becoming a 'Snap'"; EE Times On-line; http://eetimes.com/article/showArticle.jhtml?articleld=18308245&printable=true; Apr. 23, 2003.
Jung; Fabrication of a 34×34 crossbar structure at 50 nm Half-pitch by UV-based Nanoimprint Lithography; Nano Letters 2004, vol. 4, No. 7, p. 1225-1229.
Jung; Fabrication of molecular-electronic circuits by nanoimprint lithography at low temperatures and pressures; Applied Physics A 2004, p. 1169-1173.
Austin; Fabrication of 5nm linewidth and 14 nm pitch features by nanoimprint lithography; Applied Physics Letters 2004, vol. 84, No. 26, p. 5299-5301.
Kumar; Features of gold having micrometer to centimeter dimensions can be formed through a combination of . . . ; Applied Physics Ltrs, Oct. 4, 1993, vol. 63, No. 14, p. 2002-2004.
Melosh; Ultrahigh-density nanowire lattices and circuits; Science Mag, Apr. 4, 2003, vol. 300, p. 112-115.
Michel; Printing meets lithography: Soft approaches to high-resolution patterning; IBM J. Res & Dev, Sep. 5, 2001, vol. 45, No. 5, p. 697-719.
Ennis; Super hardening of W/NbN Nanolayers under shallow nanoindentation; Thesis-BSME, Univ of Pittsburgh, 2002, 60pgs.

* cited by examiner

*Primary Examiner*—Roy Karl Potter

(57) ABSTRACT

A method of using a contact printing stamp, including forming a transfer material on a plurality of stamping surfaces. The plurality of stamping surfaces are disposed on a plurality of stamp protrusions adapted from the forming of a stamp material in a plurality of recessed regions formed in an exposed end-region of a multilayer thin film structure.

48 Claims, 12 Drawing Sheets

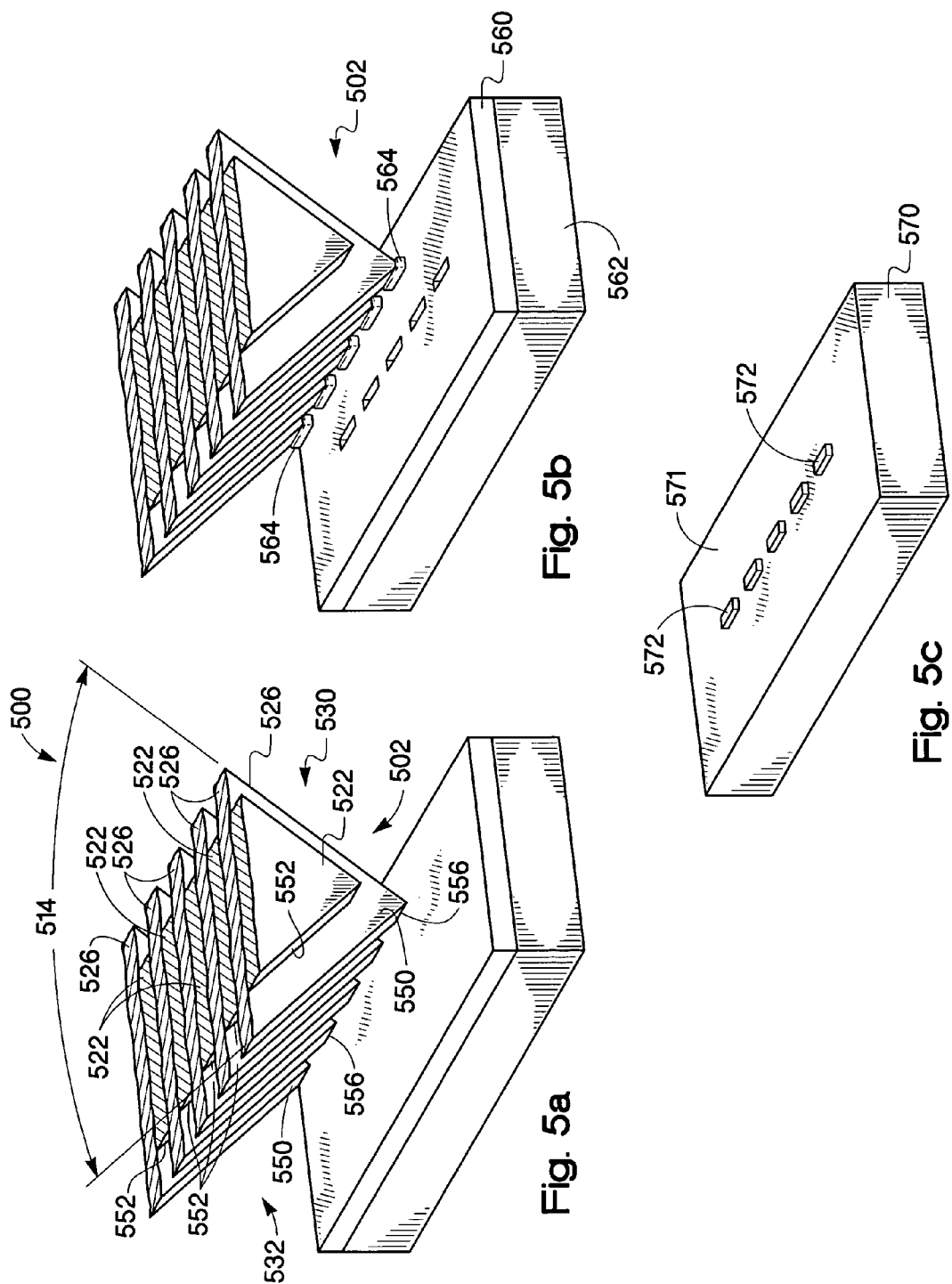

METHOD OF UTILIZING A CONTACT PRINTING STAMP

CROSS-REFERENCE TO RELATED APPLICATION

This application is related to co-pending and commonly assigned application serial number 11/046,321 filed 28 Jan. 2005 by Pavel Kornilovich, Peter Mardilovich, and Kevin F. Peters and entitled "Method of Forming a Contact Printing Stamp."

BACKGROUND

Description of the Art

Over the past few years, the demand for ever cheaper and lighter weight portable electronic devices has led to a growing need to manufacture durable, lightweight, and low cost electronic circuits of increasing complexity, including high density memory chips. To a large extent, over the past thirty years, this growth has been fueled by a nearly constant exponential increase in the capabilities of microelectronic devices; producing unprecedented advances in computational, telecommunication, and signal processing capabilities. In turn, this increase in complexity has driven a corresponding decrease in the feature size of integrated circuit devices, which has typically followed "Moore's Law." However, the continued decrease in feature size of integrated circuits, into the nanometer regime, has become increasingly more difficult, and may be approaching a limit, because of a combination of physical and economic reasons. Nanometer scale devices have been found particularly suited for use in small or densely structured devices, such as sensors, microprocessors, memory devices, logic chips, and displays. A similar evolution towards decreasing feature size has begun in the field of bio-analytical microarrays, particularly for genomic and more recently proteomic tests.

Prior proposed solutions to the problem of fabricating nanometer-scale devices have typically fallen into two broad categories, one general area can be described as new patterning techniques, and the other general area involves new materials having nanometer-scale dimensions. New patterning techniques include both projection systems utilizing electromagnetic radiation, and direct write systems utilizing particle beams, or scanning probes. Some of the newer higher resolution projection systems require expensive radiation sources such as synchrotrons. On the other hand direct write systems, typically, require a serial process of individually writing each structure in contrast to exposing many structures at one time utilizing projection systems. Thus, direct write systems, typically, have a much lower throughput when compared to projection systems again leading to either increased complexity in manufacturing or increased cost or both.

Recently to address this need for nanometer scale devices etched multilayer structures, sometimes referred to as a superlattice, have been used. An example of using an etched, superlattice stamp to perform imprint lithography is described in U.S. Pat. No. 6,407,443. This example of imprint lithography uses a nano-imprinting step, which has so far not been consistently and successfully used in a manufacturing process. In addition, this example also includes lithographic materials and several processes that may limit its process capability. Finally, another approach utilizes materials synthesized to have nanometer-scale dimensions to fabricate nanometer-scale devices. However, after these nanometer-scale materials are formed, they are often randomly arranged, either one end randomly attached to a substrate or both ends free. This randomness along with the difficulty of physically manipulating nanometer-sized components presents a significant challenge to the fabrication of reproducible and practical nanometer-scale devices.

If these problems persist, the continued growth, seen over the past several decades, in cheaper, higher speed, higher density, and lower power integrated circuits used in electronic devices will be impractical. Consumer demand for cheaper, smaller, more reliable, higher performance devices constantly puts pressure on improving and developing cheaper, and more reliable manufacturing materials and processes. There is an ever present need for lower cost electronic devices which make use of low cost materials, and low cost and relatively simpler manufacturing processes. The ability to optimize the formation of nanometer-scale devices, will open up a wide variety of applications that are currently either impractical or are not cost effective.

BRIEF DESCRIPTION OF THE DRAWINGS

FIG. 3b and 3c are cross-sectional views illustrating the transfer of material to the contact printing stamp shown in FIG. 3a.

FIGS. 5a-5c are isometric views illustrating a method of forming an array of dots according to an alternate embodiment of the present invention.

DESCRIPTION OF THE PREFERRED EMBODIMENTS

This invention is directed to utilizing a contact printing stamp created using multilayer thin film structures, sometimes referred to as superlattices, to act as the template, mold, or some combination thereof in forming the stamp. Typically, the present invention utilizes alternating layers of two dissimilar materials having differing etching or removal rates to form the master mold surfaces for generating the protrusions and indentations of the contact printing stamp. In addition, multiple materials may be utilized in the multilayer thin film structure to generate even more complex template structures. The contact printing stamp of the present invention may be fabricated by a variety of techniques and materials. The present invention enables a reduction in the characteristic feature size formed in the contact printing stamp from approximately 80 nanometers to 2 or 3 nanometers or even lower. The present invention also allows for larger features, up to microns in characteristic feature size, to be fabricated and provided in perfect or substantially perfect registry with nanosized features; as well as providing a low-cost alternative method of fabricating features greater than 80 nanometers compared to conventional techniques. Nanoscale contact printing has the advantage that deposition of the useful material does not require the additional deposition of sacrificial materials, as typically required in other nanoscale lithographic methods. Further, by utilizing the multilayer thin film structure as a template and mold to generate many contact printing stamps, the present invention provides for a less complex and cost effective technique to enable a lower cost manufacturable process for fabricating nanometer scale devices.

It should be noted that the drawings are not true to scale. Further, various elements have not been drawn to scale. Certain dimensions have been exaggerated in relation to other dimensions in order to provide a clearer illustration and understanding of the present invention. In particular, vertical and horizontal scales may differ and may vary from one drawing to another. In addition, although some of the embodiments illustrated herein are shown in two dimensional views with various regions having height and width, it should be clearly understood that these regions are illustrations of only a portion of a device that is actually a three dimensional structure. Accordingly, these regions will have three dimensions, including length, width, and height, when fabricated on an actual device.

Moreover, while the present invention is illustrated by various embodiments, it is not intended that these illustrations be a limitation on the scope or applicability of the present invention. Further, it is not intended that the embodiments of the present invention be limited to the physical structures illustrated. These structures are included to demonstrate the utility and application of the present invention to presently preferred embodiments.

Figure 1A:
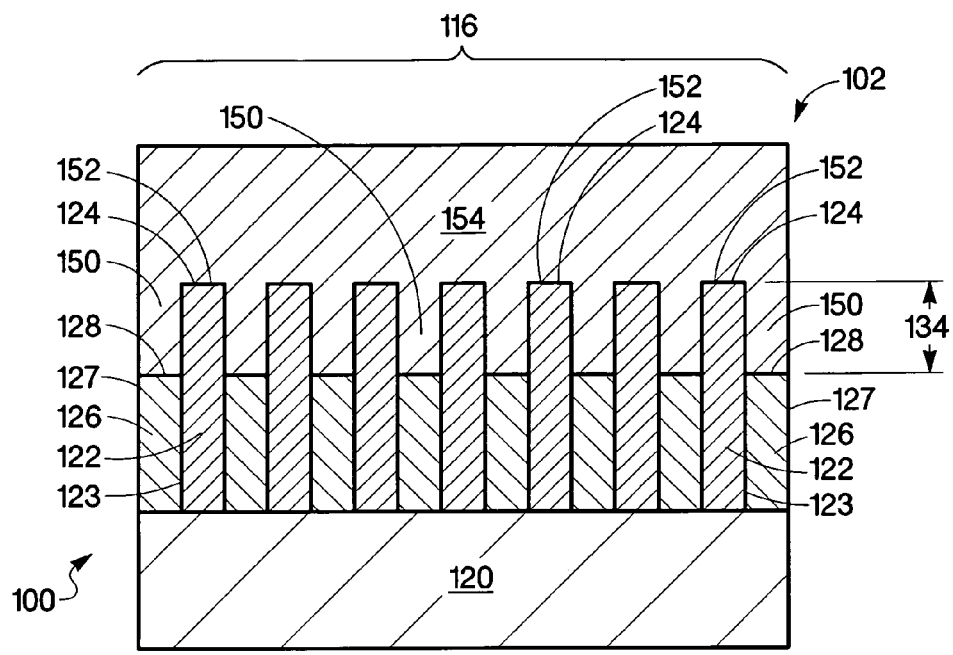
FIG. 1a is a cross-sectional view of a multilayer thin film structure and of a contact printing stamp according to an embodiment of the present invention.

A cross-sectional view of an exposed end region of multilayer thin film structure 100 utilized in the present invention is shown in FIG. 1a. Multilayer thin film structure 100 includes at least two or more different material layers, as illustrated in FIG. 1a. Multilayer thin film structure 100, in this embodiment, includes alternating first material layers 122 and second material layers 126 disposed on multilayer base 120. First material layers 122 include first material layer major surfaces 123, and second material layers 126 include second material layer major surfaces 127 in which first and second material layer major surfaces are substantially parallel to each other. A wide variety of deposition techniques may be utilized to fabricate the multilayer thin film structure, such as sputtering or other methods of physical vapor deposition; chemical vapor deposition including metallo-organic (MOCVD) or plasma enhanced (PECVD), as just two examples; atomic layer deposition, evaporation techniques, such as electron beam or thermal evaporation; electro deposition, such as electroplating, electrochemical oxidation, electroless deposition; and epitaxial growth techniques (i.e. perfect or substantially perfect lattice registry of one material to another material upon which it is deposited); spin coated and other mechano-fluidic techniques; and the like. FIG. 1a, also for illustrative purposes only, shows first and second material layers 122 and 126 having substantially the same thickness. In this embodiment, both the first and second material layers may be generated having different thicknesses as well as varying thicknesses, or combinations of both. Virtually, any combination of thicknesses may be utilized including from a few nanometers to micrometers in thickness and even thicker. In one particular embodiment the thicknesses are in the range from a few nanometers to about 80 nanometers. The thickness or thicknesses utilized will be application specific and will depend both on the characteristic feature size or sizes to be formed in the molding process as well as the pitch or separation of the desired characteristic features. In one embodiment the thickness is less than 80 nanometers. The present invention can be made to work with any dimension greater than a few nanometers and need not be limited to the nanometer scale.

First and second material layers 122 and 126 may be formed utilizing most solid materials that can be deposited, formed, or various combinations thereof, into thin layers. A wide variety of elemental, binary, and multi-component materials may be utilized. In addition, first and second material layers may themselves be formed utilizing multiple layers. Conductive materials, such as one or more metals, metal alloys, or cermets may be utilized. A few examples of metal include platinum, palladium, beryllium, aluminum, tantalum, tungsten, rhenium, rhodium, nickel, gold, and silver. A wide variety of conductive oxides also may be utilized such as indium tin oxide, vanadium oxide, or yttrium barium copper oxide. Semiconductive materials such as silicon, diamond, germanium, gallium arsenide, aluminum gallium arsenide, indium phosphide, cadmium telluride, zinc oxide, silicon carbide, tin oxide, indium tin oxide also may be utilized to form either the first or second layers or both. Non-conductive materials, such as polymeric and ceramic materials also may be utilized. A few examples of ceramic materials includes glasses, such as any of the borosilicate, soda lime or quartz glasses (including crystalline and amorphous glasses) as well as silicon oxides, nitrides, and silica mixed with oxides of, for example, potassium, calcium, barium or lead; other various nitrides, borides, and carbides such as boron nitride, silicon carbide, and sapphire. Examples of the wide variety of polymeric materials includes polyimides, polycarbonates, polyesters such as polyethylene terephthalate, polystyrene, acrylics, and polyacrylates such as polymethylmethacrylate.

The choice of the material combination will be application-specific and will depend on various factors such as the differential etching or removal rates, the temperature stability, and the environmental conditions to which the material will be subjected. Both first and second material layers 122 and 126 also may be formed utilizing any combination of types of materials. A few non-limitative examples include, both layers formed using metals, both ceramic, both semiconductive, one semiconductive and one metal, one polymeric and one ceramic, and one metal and one ceramic. For example one layer may be boron-doped p-type silicon and the other layer may be phosphorous-doped n-type silicon which have some different chemical properties. In addition, both layers also may include more than one material, such as various combinations of nitrides and oxides, or a metal alloy, or various combinations of ceramics and metals, or combinations of polymeric materials.

As shown in FIG. 1a, multilayer thin film structure 100 also includes exposed end region 116 that includes recessed regions 134 formed in second material layer 126. Recessed regions 134 have a depth equal to the difference between first material edge 124 and second material edge 128. It should be understood that recessed regions 134, in the present invention, may be formed in any of the material layers or groups of layers. The particular layers chosen will depend on the particular application in which the contact printing stamp will be utilized.

In this embodiment, recessed regions 134 may be formed utilizing various etching or other material removal techniques and even combinations thereof. Non-limitative examples include wet or dry etching, or combinations of both, and ion milling. In those embodiments utilizing wet or dry etching or combinations of both the etching rate of one material relative to the other is generally immaterial so long as there is a differential etching rate between the materials chosen to fabricate the multilayer thin film structure. Typically a differential etching rate of four to five times or even more may be employed to minimize the amount of etching of the material or materials utilized to form the layers not being etched. Further, in those embodiments utilizing an anodizable metal forming either one or both layers, electrochemical oxidation may be utilized to oxidize the metal from the edge to a desired depth with subsequent etching of the electrochemically formed oxide to form recessed regions 134. For example, Al, Ta, and W may be anodized and their oxides may be selectively etched. An example of an etching solution that selectively etches the aluminum oxide formed during anodization of aluminum, includes a mixture of phosphoric acid ($H_3PO_4$), in the range of from about 5 weight percent to about 40 weight percent, chromium oxide ($CrO_3$), in the range of from about 2 weight percent to about 15 weight percent, and water. Typically, the selective etch is heated to a temperature in the range from about 80° C. to about 100° C.

Figure 1B:
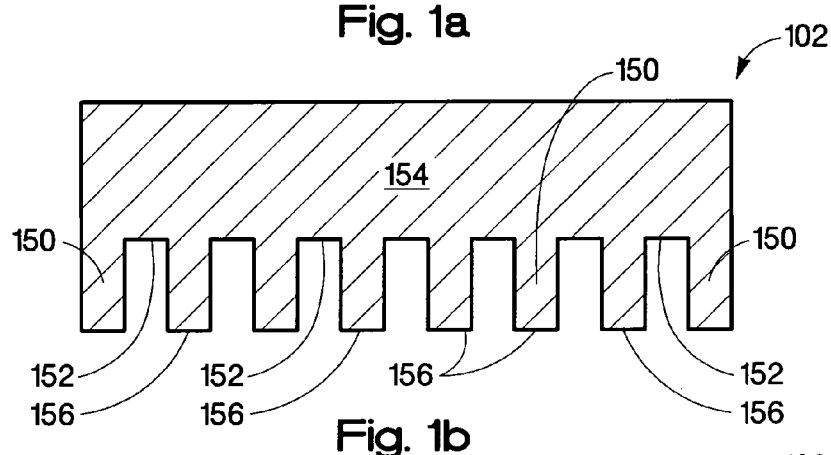
FIG. 1b is a cross-sectional view of a contact printing stamp according to an embodiment of the present invention.

FIG. 1a, also illustrates the formation of contact printing stamp 102 on exposed end region 116 of multilayer thin film structure 100 according to an embodiment of the present invention, and FIG. 1b illustrates the completed contact printing stamp after removal or separation from the multilayer thin film structure. Contact printing stamp 102, in this embodiment, includes stamp protrusions 150 formed by creating, or forming, or various combinations thereof, a stamp material in recessed regions 134 of multilayer film structure 100. Stamp protrusions 150 end at second material edge 128 of multilayer thin film structure 100 as illustrated in FIG. 1a. In addition, as shown in FIG. 1a contact printing stamp 102 also includes stamp indentations 152 corresponding to first material edge 124. Further, contact printing stamp also includes stamp base 154 which essentially is that portion of the stamp distal to the stamp protrusions and indentations. The exact demarcation between the stamp base and protrusions is application specific and will depend on various factors such as the Young's modulii of the material utilized to form the stamp, the aspect ratio (i.e. the height of the characteristic features divided by their lateral dimension), and the surface roughness and hardness of the surface onto which the stamp will transfer material. Thus, in this embodiment, protrusions 150 and indentations 152 have a depth equal to the difference between first material edge 124 and second material edge 128 of multilayer thin film structure 100 from which they were formed. The length, width, and shape of the protrusions and indentations formed may be varied and is intended to include a wide range of lengths, widths and shapes. The desired structures of contact printing stamp 100 are represented by protrusions and indentations. In particular the width and shape shown in FIG. 1a and the length (not shown) is meant for illustrative purposes only. In addition, exposed end region 116 of multilayer thin film structure 100 may also include a release layer disposed on first material edge 124 and on the surfaces forming recessed regions 134 including second material edge 128. A wide variety of surface modifying compounds or molecules may be utilized to form the release layer such as molecules having fluorinated hydrocarbon chains or polysiloxanes. Perfluorohexyl trichlorosilane, perfluorodecyl trichlorosilane, and perfluorohexylpropyl trichlorosilane are just a few non-limitative examples of compounds that may be utilized as a release layer.

As is illustrated in FIGS. 1a and 1b contact printing stamp 100 has a substantially complementary shape to the features or structures formed in multilayer thin film structure 100. By complementary, it is meant that the pattern formed in contact printing stamp 100 has a shape corresponding to the complement of the shape formed in multilayer thin film structure 100. As illustrated in FIG. 1b contact printing stamp 102 includes protrusions 150 and indentations 152. Protrusions 150 form printing surfaces 156 through which patterning of a material surface may be carried out. As noted above the utilization of simple lines and spaces as shown in FIG. 1b is for illustrative purposes only and does not limit the type or shape of structures that may be formed on contact printing stamp 102. As will be described in greater detail below both curved and straight structures as well as combinations thereof may form printing surfaces 156. In addition, the square wave nature of the change from a protrusion to an indentation also may be varied including triangular and sinusoidal as well as various combinations of the two. It should be understood that the present invention may utilize a wide variety of functions in characterizing the change from a protrusion to an indentation and back including substantially straight sidewalls with rounded corners. Contact printing stamp 102 also includes stamp base 154.

In the embodiment, shown in FIGS. 1a and 1b, stamp base 154 is formed utilizing the same material as that utilized to form stamp protrusions 150 and stamp indentations 152. However, in alternate embodiments, stamp base 154 also may include additional materials including multiple layers, or gradients in composition or various combinations thereof. For example, stamp base 154 may include a soft cushion material disposed between a stiff material utilized to form the protrusions and indentations and a hard back plane material in which stamp base 154 is terminated.

The material utilized to form protrusions 150 and indentations 152 may be any moldable material. That is any material that either flows or is pliable under a first condition and relatively solid and less pliable under a second condition may be utilized. Examples of non-polymeric materials that may be utilized for the stamp material include metals and metal alloys having melting points below the temperature at which first and second material layers 122 and 126 of multilayer thin film structure would be degraded or damaged. For example, the first and second material layers may be formed using high temperature ceramics when a metal contact printing stamp is desired. In addition, a wide variety of polymeric materials may be utilized to form contact printing stamp 100 in the present invention. Examples of various polymers that may be utilized include, various photo curable polymers, polymethyl methacrylate (PMMA), polycarbonates, polyimides, and siloxanes such as poly(dimethylsiloxane) (PDMS). However, it should be understood that these are just a few examples and are not meant to limit the stamp materials that may be utilized in the present invention. For example, to create the stamp material in the recessed regions, poly(dimethylsiloxane) prepolymers, such as that sold by Dow Corning Incorporated under the name Sylgard 184 may be poured onto the exposed end region of the multilayer thin film structure and cured. In addition, siloxane polymers having a higher Young's modulus may be utilized to decrease the defect density when printing small feature sizes below about 100 nanometers. For example, polymers having two populations of chain lengths may be utilized to increase the Young's modulus. The utilization of organic or inorganic fillers, or combinations of both also may be utilized separately or in combination with bimodal chain length polymers. In addition, monomers may also be used with subsequent polymerization or a mix of monomers and oligomers also may be utilized. Another example is PMMA that may be either solvent cast and/or poured onto the exposed end region or heated above its softening or glass transition temperature and the exposed end region of the multilayer thin film structure is pressed into the softened PMMA with subsequent cooling of the PMMA. This latter technique is commonly referred to as imprinting or embossing. The particular temperature and pressure utilized in the thermal imprinting process will depend on various parameters such as the size and shape of the features being molded. Still another example is the use of a polyamic acid solution poured onto the exposed end region and then cured chemically or thermally to form a polyimide. An example of a photo-curable material includes a material sold by Molecular Imprints Inc. under the name S-FIL Monomat Ac01, which may be cured by an exposure with l-line radiation (i.e. 365 nanometers) utilizing a photo source such as 100 Watt Hg—Se ultraviolet arc lamp. Another photo-curable material that may be utilized is a material that includes ethylene glycol diacrylate (3-acryloxypropyl)tris(trimethylsiloxy)silane, t-butyl acrylate, and 2-hydroxy-2-methyl-1-phenylpropan-1-one.

Figure 1C:
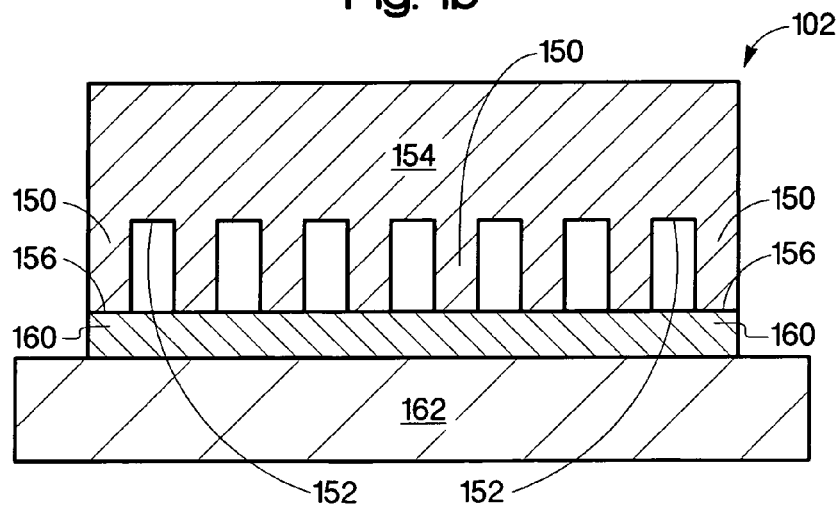
FIGS. 1c and 1d are cross-sectional views illustrating the transfer of material to the contact printing stamp shown in FIG. 1b.

FIG. 1c, a cross-sectional view, illustrates the transfer or formation of material on contact printing stamp 102 after separation or removal from multilayer thin film structure 100 (see FIGS. 1a and 1b). The transfer, or formation, or a combination of both, of a material or materials onto printing surface 156 of contact printing stamp 102 may be carried out using a wide variety of materials and techniques. In this embodiment, stamp 102 is placed essentially in contact with transfer layer 160 as illustrated in FIG. 1c. The term essentially in contact is used here to include moving the stamp sufficiently close to the transfer material to facilitate some transfer of transfer layer 160 to printing surface 156 but the stamp may still not be in actual physical contact.

In this embodiment, transfer material is illustrated as a thin film disposed on transfer material support 162. However, in alternate embodiments, other methods to form transfer layer 160 on printing surface 156. For example, in those embodiments, in which it is desirable to transfer a monolayer of material (e.g. alkane thiols), a small amount of solution of the transfer material may be poured or placed on the stamp printing surface. After a desired amount of time the excess solution may then be removed under a stream of dry air, nitrogen, or other gas. Other examples include transfer of material in a vapor or vapor-like phase, electro or electroless deposition onto printing surface 156 as well as use of a chemical reaction at the printing surface including photochemical reactions.

In addition, in the embodiment shown in FIG. 1c transfer material support 162 is illustrated as essentially a planar support and transfer layer 160 is illustrated as a thin film. However, in alternate embodiments, other support shapes also may be utilized such as a cylindrical or curved shape where printing surface 156 of stamp 102 may come into essential contact via some degree of rotation or bending of the stamp or of the receiving surface. Further, in alternate embodiments, transfer layer also may have a non planar structure. For example, transfer material support may be a porous material saturated with a solution of a transfer material such as an alkane thiol solution or a solution of nanoparticles.

A wide range of materials, including inorganic and organic materials in solution, paste, and solid form may be transferred utilizing contact printing stamp 102. Additional transfer materials include molecular recognition agents such as antibodies, enzymes, proteins, amino acids, aptamers, nucleic acids, molecular receptors, chelation compounds, and mixtures thereof. In addition, molecular recognition agents that are further conjugated with intermediate attachment moieties such as thiolated moieties or biotinylated moieties also may be transferred utilizing contact printing stamp 102. Further, non-conjugated attachment molecules such as alkane thiols, silane coupling agents, and biotin also may be transferred. Contact printing, in particular nanoscale printing, has the advantage that the deposition of the transfer material does not require the additional deposition of sacrificial materials as is generally required in other patterning techniques.

Figure 1D:
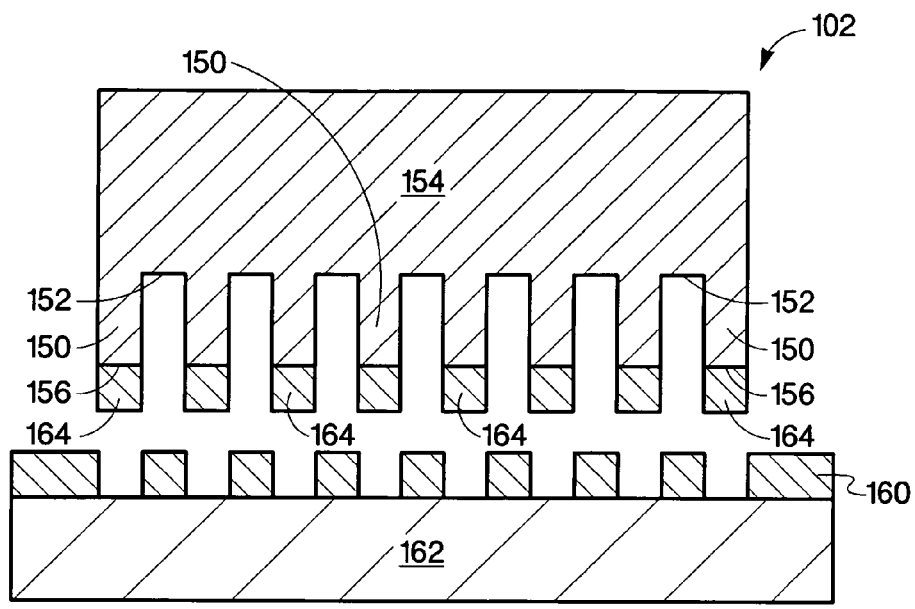
Figure 1E:
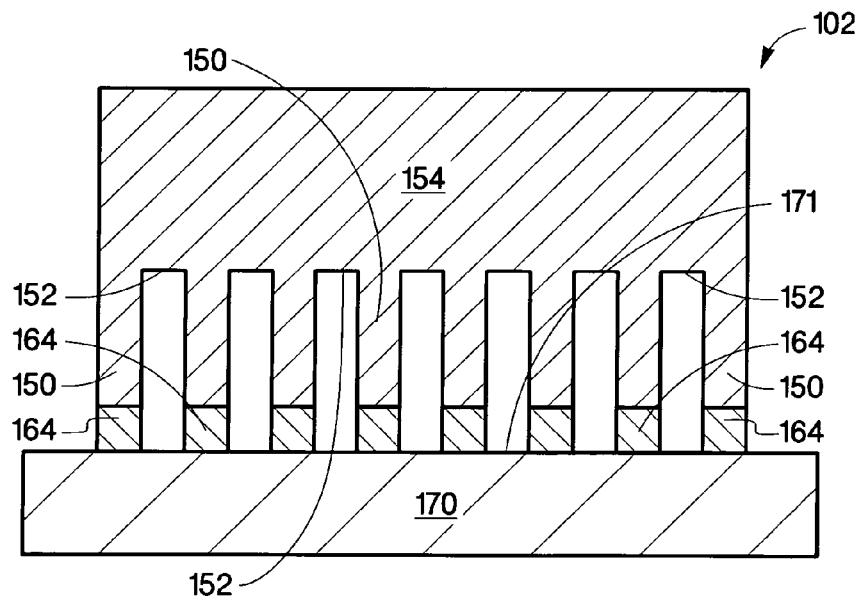
FIGS. 1e and 1f are cross-sectional views illustrating the transfer of material from the contact printing stamp shown in FIG. 1d to a receiving surface.
Figure 1F:
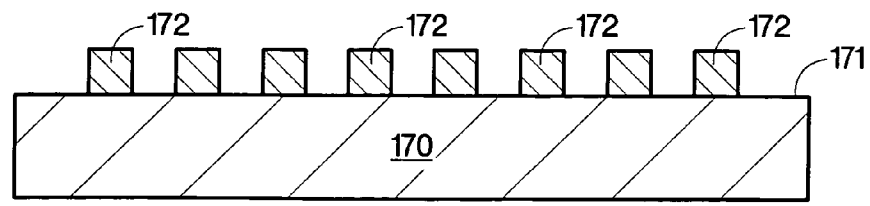

After the desired transfer of sufficient material from transfer layer 160 has taken place, stamp 102 may then be separated from transfer layer 160 and transfer material support 162 as illustrated in a cross-sectional view in FIG. 1d. Contact printing stamp 102 along with stamp adherent material 164 transferred to and/or in contact with printing surface 156 may then be brought in contact with or essentially in contact with receiving surface 171 of receiving substrate 170 as illustrated in a cross-sectional view in FIG. 1e. As previously described the term essentially in contact is used to indicate moving the stamp sufficiently close to facilitate some transfer of material without the stamp actually being in physical contact with the receiving surface. After sufficient transfer of stamp adherent material 164 has taken place stamp 102 may then be separated from receiving surface 171 of receiving substrate 170. The material transferred from stamp 102 to receiving surface 171 forms patterned material 172 on receiving substrate 170 as illustrated in a cross-sectional view in FIG. 1f. Patterned material 172 can have nanometer scale dimensions or greater in all three dimensions as well as various combinations of nanometer dimensions and larger dimensions such as lines having a thickness of about 20 nanometers, a width of about 50 nanometers and a length of several hundred micrometers or even several millimeters. Patterned material 172 and receiving substrate 170 may then undergo further processing to form a nanometer scale device.

Figure 1G:
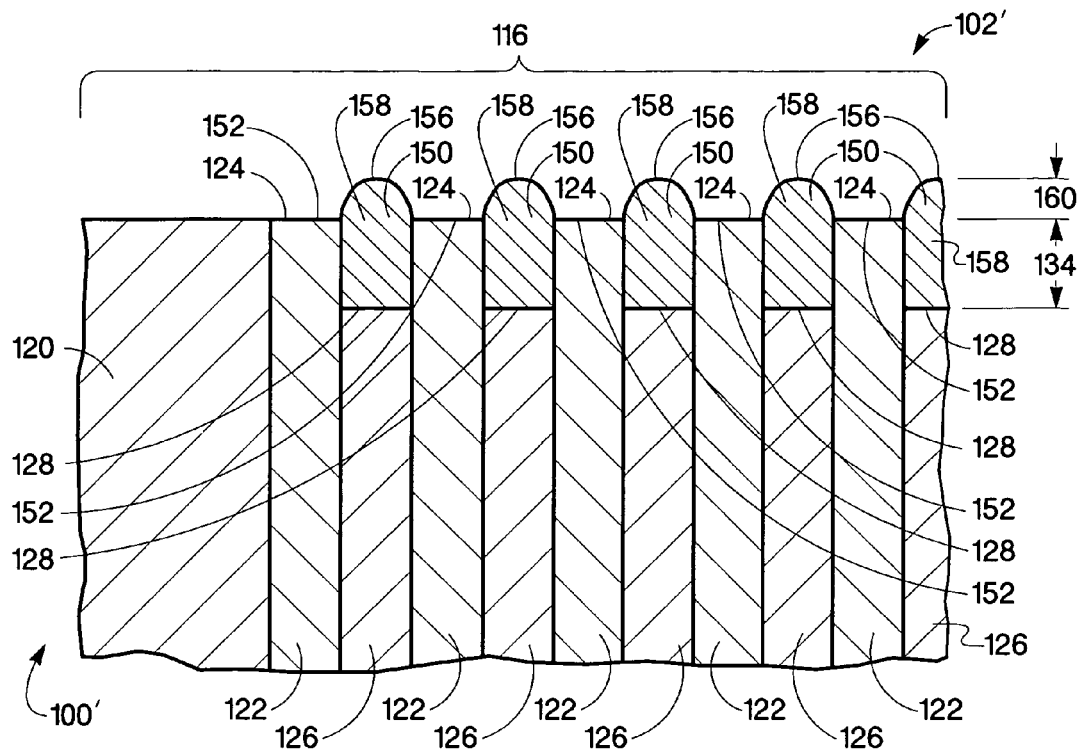
FIG. 1g is a cross-sectional view of a stamp material formed in an exposed end region of a multilayer thin film structure according to an alternate embodiment of the present invention.

An alternate embodiment of the formation of a contact printing stamp utilizing a multilayer thin film structure to form a portion of the contact printing stamp in the present invention is shown, in cross-sectional view in FIG. 1g. Multilayer thin film structure 100' may be the same or similar to the structure shown in FIG. 1a. In this embodiment, stamp material 158 is created in recessed regions 134 formed in exposed end region 116 of multilayer thin film structure 100'. The depth of recessed region 134 is the difference in height between first material layer edge 124 and second material edge 128. In this embodiment, stamp protrusion 150 and printing surface 156 are created by forming an excess amount of stamp material having substantially the same or smaller width as the width of recessed region 134 (e.g. the thickness of second material layer 126) and extending above first material edge 124 of first material layer 122. In such an embodiment, the combination of stamp material 158 and multilayer thin film structure 100' combine to form contact printing stamp 102'. However, it should be understood that the protrusion of stamp material 158 as shown in FIG. 1g illustrates only one way in which multilayer thin film structure 100' may be incorporated into a contact printing stamp. Stamp material 158 also may fill only a portion of the recessed regions, or the stamp material may self align or form a co-planar surface with first material edge 124, or even combinations thereof as will be explained below.

As described earlier the material utilized to create stamp material 158 may be any moldable material. That is any material that either flows or is pliable under a first condition and relatively solid and less pliable under a second condition may be utilized. Contact printing stamp 102' includes stamp protrusions 150 and stamp indentations 152 where stamp protrusion height 160 is the difference in height from first material edge 124 and printing surface 156 (i.e. stamp protrusion height is the excess amount of stamp material extending above first material edge 124). As described earlier for the multilayer thin film structure, shown in FIG. 1a, the width and shape and the length (not shown) of the protrusions and indentations formed may be varied and is intended to include a wide range of lengths, widths and shapes. The desired structures of contact printing stamp 102' are represented by protrusions and indentations and in particular the width, and shape shown in FIG. 1g, as well as the length (not shown) is meant for illustrative purposes only.

Figure 1H:
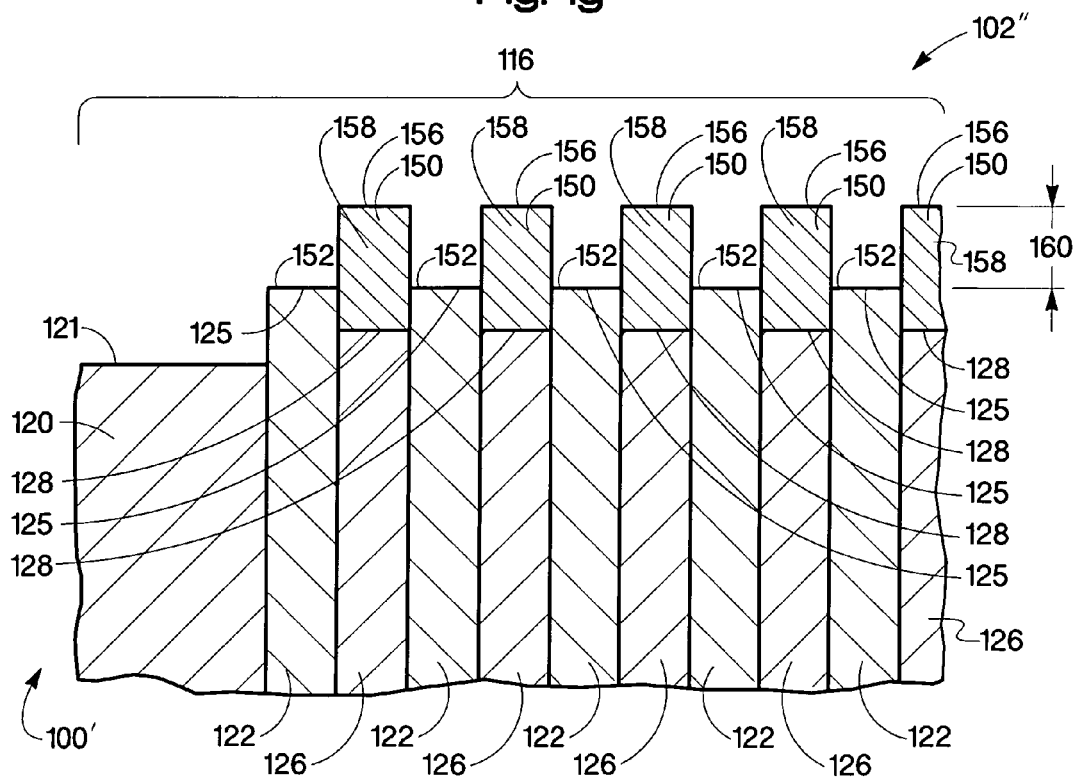
FIG. 1h is a cross-sectional view of a contact printing stamp according to an alternate embodiment of the present invention.

An alternate embodiment illustrating the use of a multilayer thin film structure as a contact printing stamp is shown, in a cross-sectional view, in FIG. 1h. Exposed end region 116 of contact printing stamp 102" may be planarized, after the creation of stamp material 158 in recessed regions 134 of exposed end region 116, for those embodiments in which stamp material 158 does not form a surface sufficient to generate a desired printing surface without further processing. For example, in those embodiments where a planar printing surface is desired and the stamp material does not form a co-planar surface with first material edge 124 (see FIG. 1g) planarization may be utilized to generate the planar surface. A wide variety of planarizing techniques may be utilized such as chemical mechanical polishing, or ion milling, or even combinations of both. The particular method utilized to planarize end region 116 will depend on a variety of factors such as the chemical and mechanical properties of the first and second material layers, the chemical and mechanical properties of the stamp material utilized, the depth of the recessed regions, and the size of the characteristic features being formed. In addition, the material layer or layers that do not form the recessed regions are also etched, removed, or various combinations of both, to a depth that is sufficient to generate printing surface 156 after stamp material 158 is created. For example, as illustrated in FIG. 1h, first material layers 122 (i.e. the layers that did not form the recessed regions) may be etched. Here first material layers 122 are etched to a depth intermediate to that of second material layers 126 forming first material etched second edge 125; however, in alternate embodiments other depths also may be utilized.

In the embodiment shown in FIG. 1h stamp material 158 may be planarized before first material layers 122 are etched; however, in alternate embodiments first material layers 122 may be etched before stamp material 158 is planarized, as well as other embodiments where combinations of etching or removal processes and planarization processes in various sequences may be utilized. In this embodiment, the edge of substrate 120 forming a portion of exposed end region 116 has also been etched, removed, or some combination thereof, to form etched substrate edge 121. In this embodiment, etched substrate edge 121 is at a depth below both first material etched second edge 125 and second material edge 128 formed in second material layer 126; however, in alternate embodiments the etched substrate edge may be at any depth that provides sufficient contact of printing surface 156 to effectuate the desired printing step. In still other embodiments, substrate 120 may be removed entirely. It should also be noted that, as shown in FIG. 1h, stamp material 158 is planarized essentially to that of first material edge 124 and thus, the difference in height between printing surface 156 and second material edge 128 is essentially equal to the depth of recessed regions 134 shown in FIG. 1g. However, in alternate embodiments, the depth to which stamp material 158 is planarized may be any depth less than the depth of second material edge 128.

Contact printing stamp 102" includes stamp protrusions 150 formed by creating stamp material 158 in recessed regions similar to that shown in recessed regions 134 illustrated in FIG. 1g of multilayer thin film structure 100'. Stamp protrusions 150, in this embodiment, may be formed by some combination of planarization and removal of first material layer to a desired depth at exposed end region 116 of multilayer thin film structure 100'. Contact printing stamp 102" also includes stamp indentations 152 where stamp protrusion height 160 is the difference in height from stamp printing surface 156 and stamp indentation 152. In this embodiment, stamp indentation is formed by first material etched second edge 125 of first material layer 122. That is the material layer or layers that do not form the recessed regions may also be etched, removed, or various combinations of both, to a depth sufficient to generate printing surface 156 after stamp material 158 is created. For example, as illustrated in FIG. 1h, first material layers 122 (i.e. the layers that did not form the recessed regions) have been etched to a depth intermediate to that of second material layers 126.

As described earlier for the multilayer thin film structure and the contact printing stamps the length, width, and shape of the protrusions and indentations formed may be varied and is intended to include a wide range of lengths, widths, and shapes. The desired structures of contact printing stamp 102" are represented by protrusions and indentations and in particular the width and shape shown in FIG. 1h, as well as the length (not shown) is meant for illustrative purposes only. It should also be noted that the shape to the features or structures formed in contact printing stamps 102' and 102" are directly related to the features or structures formed in multilayer thin film structure 100'.

Figure 2A:
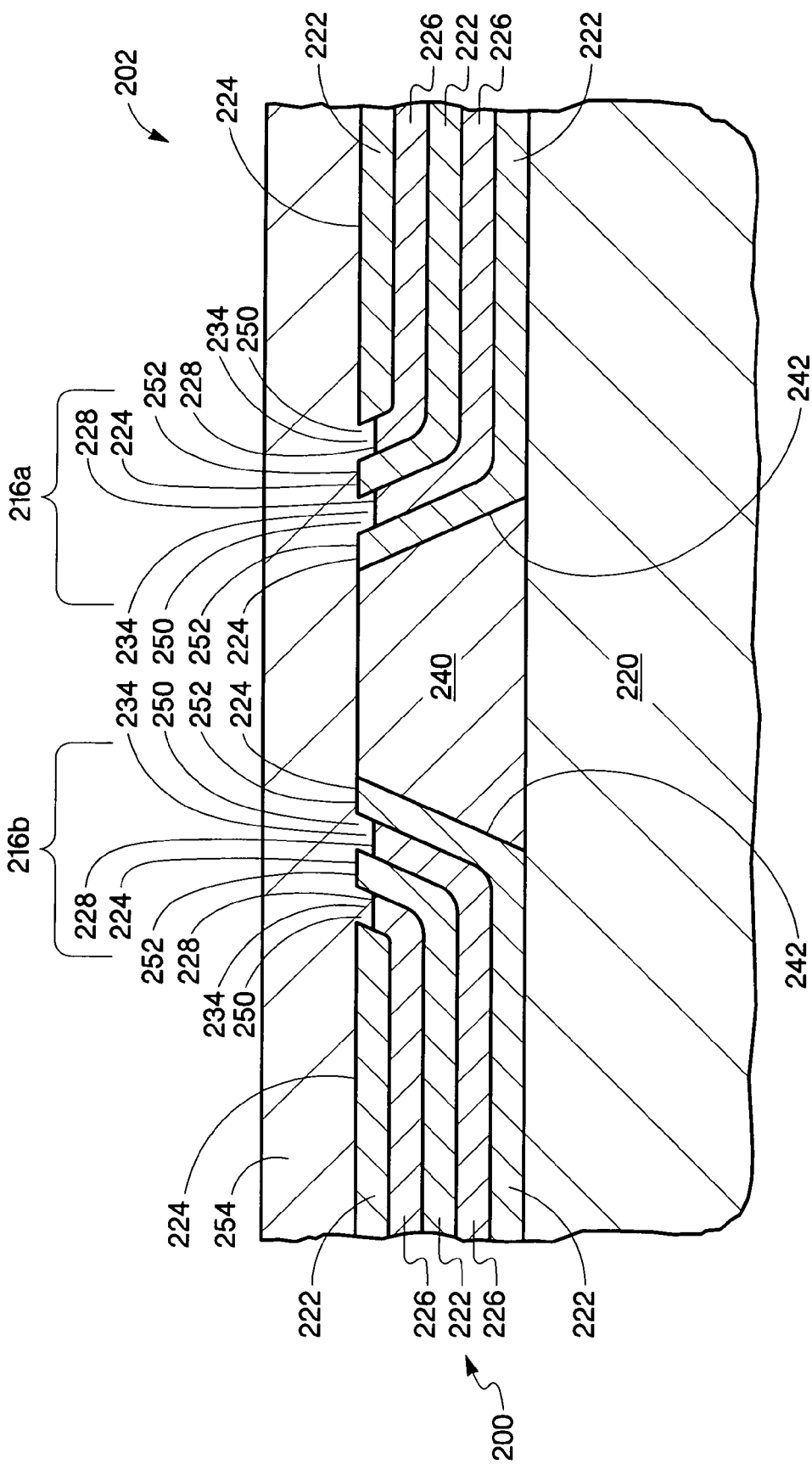
FIG. 2a is a cross-sectional view of a multilayer thin film structure and of a contact printing stamp according to an alternate embodiment of the present invention.

An alternate embodiment of a multilayer thin film structure that may be utilized in the present invention is shown, in a cross-sectional view, in FIG. 2a. In this embodiment, multilayer thin film structure 200 includes sidewall forming structure 240 formed on multilayer substrate 220. In this embodiment, sidewall forming structure 240 includes sidewalls 242 each forming an angle of about 60 degrees relative to the substrate surface. However, in alternate embodiments, sidewalls 242 may have any angle in the range from about ten degrees to about ninety degrees.

In this embodiment, sidewall forming structure 240 is a photoresist such as SPR 3625 (Shipley Positive Resist) sold by Rohm and Haas Electronic Materials. The SPR 3625 photoresist may be heated to alter its cross-sectional shape and thereby change the angle of sidewalls 242. Through control of the time and the temperature the normally substantially vertical sidewalls obtained using conventional photolithographic processing may be altered to form a more acute angle. Generally the longer the time, or the higher the temperature or various combinations thereof lead to more acute angles. In addition, although FIG. 2a shows only one sidewall forming structure, multilayer thin film structure 200 may include many different sidewall forming structures disposed on substrate 220. These sidewall forming structures may be very thin (i.e. the distance between the sidewalls is small) allowing for exposed end regions of material layers formed on either side of the sidewall forming structures to be very close together. These structures may also be thick allowing for sets of parallel exposed edges that are far apart. In addition, these structures may also be of nearly arbitrary shape and length. The shape of these structures substantially controls the shape of the exposed material edges of the material layers formed thereon. Further, these structures can have various slopes to their sidewalls, allowing for the variation in thicknesses of the exposed edges of the multilayer thin film disposed thereon.

Multilayer thin film structure 200 also includes alternating first material layers 222 and second material layers 226 disposed on substrate 220 as shown in FIG. 2a. Although FIG. 2a shows first material layer 222 disposed on substrate 220 it should be understood that either layer may be disposed on the substrate and that additional layers (not shown) may be disposed between substrate 220 and the first layer of the multilayer thin film stack. Multilayer thin film structure 200 also includes exposed end regions 216a and 216b that include recessed regions 234 formed in second material layer 226. Recessed regions 234 have a depth equal to the difference between first material edge 224 and second material edge 228. As described earlier a wide variety of deposition techniques may be utilized to fabricate first and second material layers 222 and 226.

FIG. 2a, also illustrates the formation of contact printing stamp 202 on multilayer thin film structure 200 including exposed end regions 216a and 216b separated by sidewall forming structure 240. Contact printing stamp 202, in this embodiment, includes stamp protrusions 250 formed by creating a stamp material in recessed regions 234 of multilayer film structure 200. Stamp protrusions 250 end at second material edge 228 of multilayer thin film structure 200. Contact printing stamp 202 also includes stamp indentations 252 corresponding to first material edge 224 and stamp base 254. Thus, protrusions 250 and indentations 252 have a depth equal to the difference between first material edge 224 and second material edge 228 of multilayer thin film structure 200 from which they were formed. As described earlier the desired structures of contact printing stamp 202 are represented by protrusions and indentations and in particular the length, width, and shape shown in FIG. 2a is meant for illustrative purposes only. Contact printing stamp 202 has a substantially complementary shape to the features or structures formed in multilayer thin film structure 200.

Figure 2B:
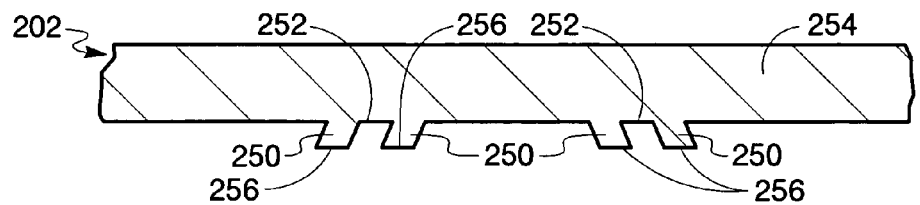
FIG. 2b is a cross-sectional view of a contact printing stamp according to an alternate embodiment of the present invention.

A cross-sectional view of contact printing stamp 202 after separation or removal from the multilayer thin film structure is shown in FIG. 2b. Contact printing stamp 202 includes protrusions 250 and indentations 252. Protrusions 250 form printing surfaces 256 through which patterning of a material surface may be carried out. In addition, as shown in FIG. 2a contact printing stamp 202 also includes stamp base 254 that is essentially that portion of the stamp distal to the stamp protrusions and indentations. The material utilized to form protrusions 250 and indentations 252 as well as stamp base 254 may be any moldable material. As noted above the utilization of sidewall forming structures allows for nanometer scale printing surfaces to be formed having nearly any arbitrary shape including both linear and curved shapes as well as combinations thereof.

Figure 2C:
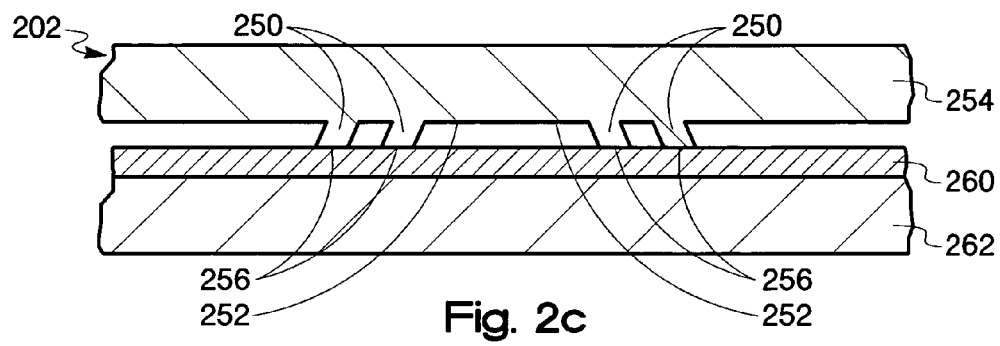
FIGS. 2c and 2d are cross-sectional views illustrating the transfer of material to the contact printing stamp shown in FIG. 2b.

FIG. 2c, a cross-sectional view, illustrates the transfer or formation of material on contact printing stamp 202 after separation or removal from multilayer thin film structure 200 (see FIGS. 2a-2b). The transfer, or formation, or a combination of both, of a material or materials onto printing surface 256 of contact printing stamp 202 may be carried out using a wide variety of materials and techniques as described earlier. In this embodiment, stamp 202 is placed in contact with or essentially in contact with transfer layer 260 as illustrated in FIG. 2c The term essentially in contact is used to indicate moving the stamp sufficiently close to facilitate some transfer of material without the stamp actually being in physical contact. As noted above although transfer material is illustrated in FIG. 2c as a thin film disposed on transfer material support 262, in alternate embodiments, other methods to form transfer layer 260 on printing surface 256 may be utilized including transfer of material in a vapor or vapor-like phase, electro or electroless deposition onto the printing surface and chemical reaction at the printing surface including photochemical reactions. In addition, other transfer material support shapes also may be utilized such as a cylindrical or curved shapes. Further, in alternate embodiments, transfer layer 260 also may have a non planar structure. A wide range of materials, including inorganic, organic, and biological materials in solution, paste, and solid form may be transferred utilizing contact printing stamp 202.

Figure 2D:
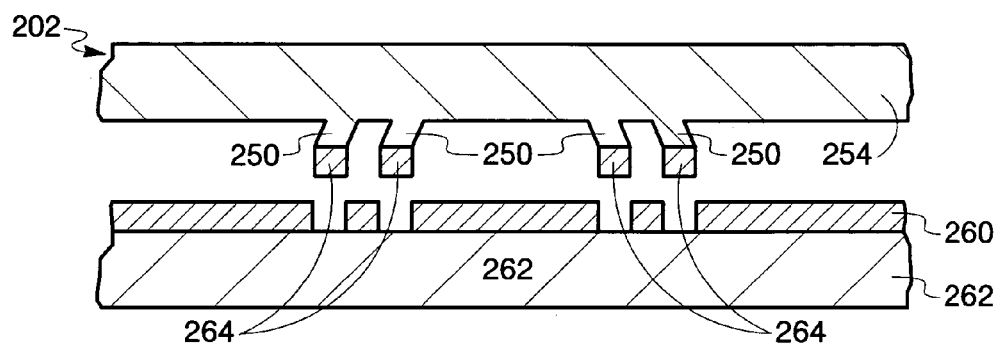
Figure 2E:
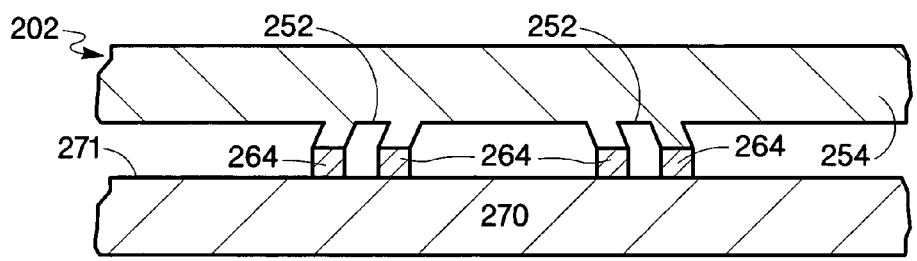
FIGS. 2e and 2f are cross-sectional views illustrating the transfer of material from the contact printing stamp shown in FIG. 2d to a receiving surface.
Figure 2F:
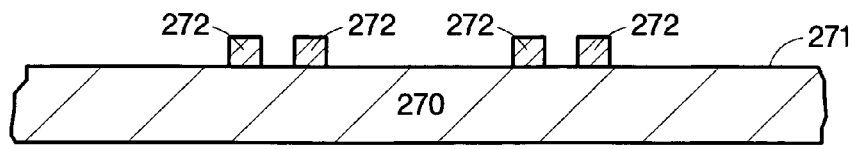

After the desired transfer of sufficient material from transfer layer 260 has taken place, stamp 202 may then be separated from transfer layer 260 and transfer material support 262 as illustrated in a cross-sectional view in FIG. 2d. Contact printing stamp 202, along with stamp adherent material 264 transferred to and/or in contact with printing surface 256, may then be brought in contact with or essentially in contact with receiving surface 271 of receiving substrate 270 as illustrated in a cross-sectional view in FIG. 2e. As previously described the term essentially in contact is used to indicate moving the stamp sufficiently close to facilitate some transfer of material without the stamp actually being in physical contact with the receiving surface. After sufficient transfer of stamp adherent material 264 has taken place stamp 202 may then be separated from receiving surface 271 of receiving substrate 270. The material transferred from stamp 202 to receiving surface 271 forms patterned material 272 on receiving substrate 270 as illustrated in a cross-sectional view in FIG. 2f. Patterned material 272 and receiving substrate 270 may then undergo further processing to form a nanometer scale device.

Figure 2G:
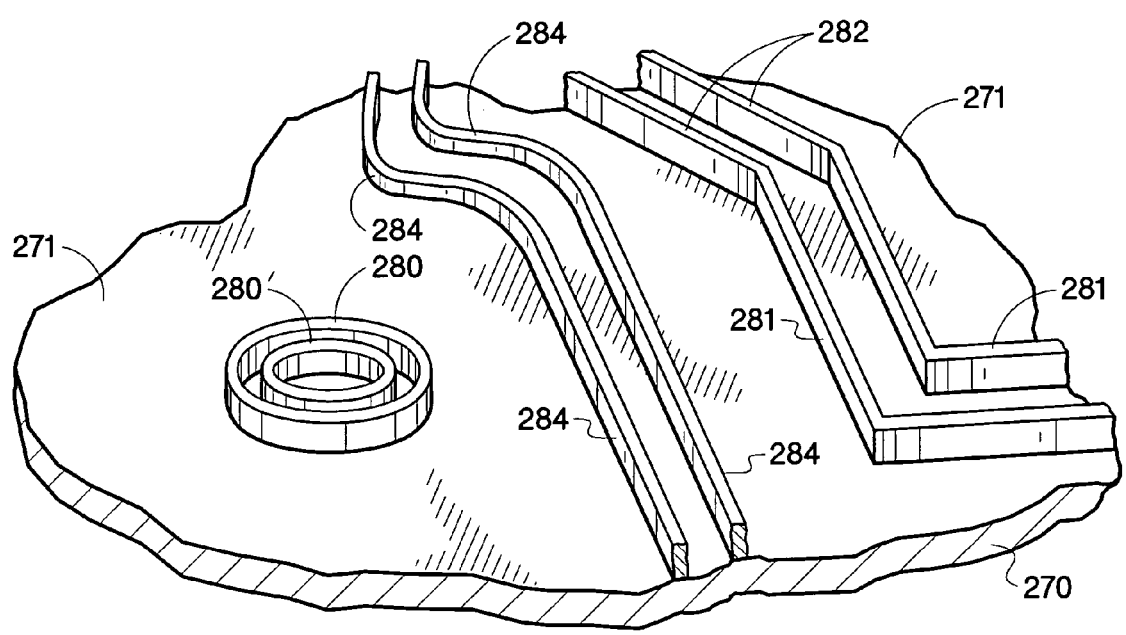
FIG. 2g is a top plan view of a receiving surface according to an alternate embodiment of the present invention.

FIG. 2g is a top plan view of a portion of a receiving substrate illustrating the nature of the structures that may be formed using the present invention. Receiving substrate 270, in this embodiment, includes receiving substrate surface 271 on which several illustrative examples of the structures that may be transferred utilizing the contact printing stamp of the embodiment shown in FIG. 2b are formed laterally across substrate surface 271. In addition, FIG. 2b shows how the sidewall forming structures can be formed into a wide variety of shapes having a near-arbitrary length and curvature. FIG. 2g illustrates the patterned material forming circular structures 280 and 280', structures at a right angle 281, structures forming an acute angle 282, and structures 284 having an arbitrary curvature and co-parallel to each other and all capable of having line widths in the range from a few nanometers to 80 nanometers and even larger. For more information on sidewall forming structures see, for example, U.S. patent application Ser. No. 10/817,729 and filed on Apr. 2, 2004, entitled "Fabrication and Use of Superlattice."

Figure 3A:
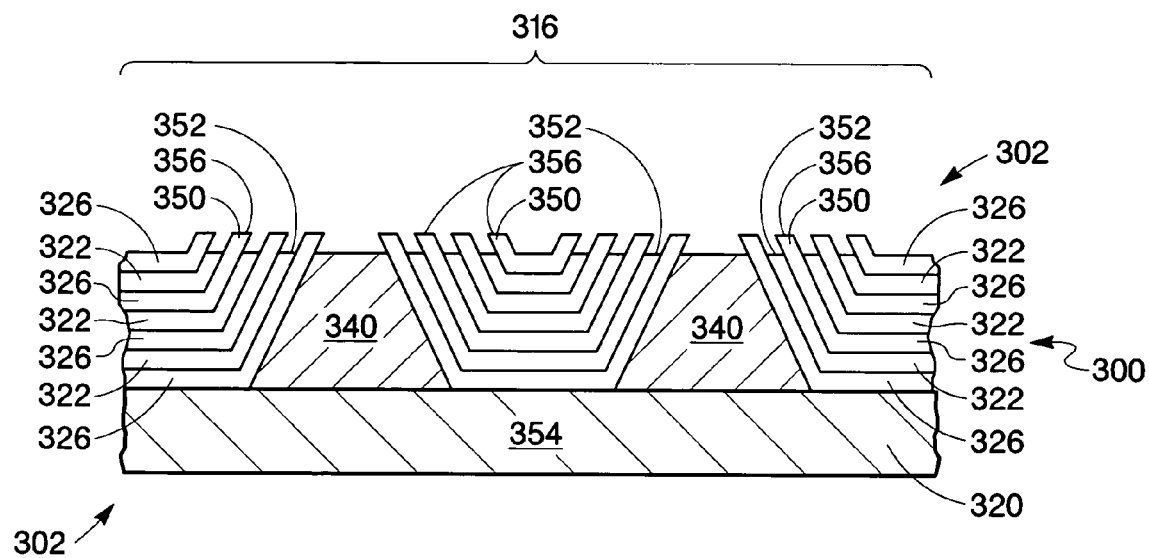
FIG. 3a is a cross-sectional view of a multilayer thin film structure utilized as a contact printing stamp according to an alternate embodiment of the present invention.

An alternate embodiment of a multilayer thin film structure that may be utilized in the present invention is shown, in a cross-sectional view, in FIG. 3a. In this embodiment, multilayer thin film structure 300 is utilized as contact printing stamp 302. Multilayer thin film structure 300 includes sidewall forming structures 340 formed on multilayer substrate 320 and may be identical or similar to multilayer thin film structure 200 shown in FIG. 2a. The processes and materials utilized to form multilayer thin film structure 200 also may be utilized to form multilayer thin film structure 300. The multilayer thin film structure includes alternating first material layers 322 and second material layers 326 disposed on substrate 320 as shown in FIG. 3a. Contact printing stamp 302 includes stamp protrusions 350 formed by selectively etching first material layers 322 of multilayer film structure 300. The end of stamp protrusions 350 forms printing surface 356. Contact printing stamp 302 also includes stamp indentations 352 corresponding to the depth to which first material layer was etched. In this embodiment, multilayer substrate 320 forms stamp base 354. Protrusions 250 and indentations 252 have a depth equal to the depth to which first material layers 322 where etched. In this embodiment, contact printing stamp 302 has the same features or structures as multilayer thin film structure 300.

Figure 3B:
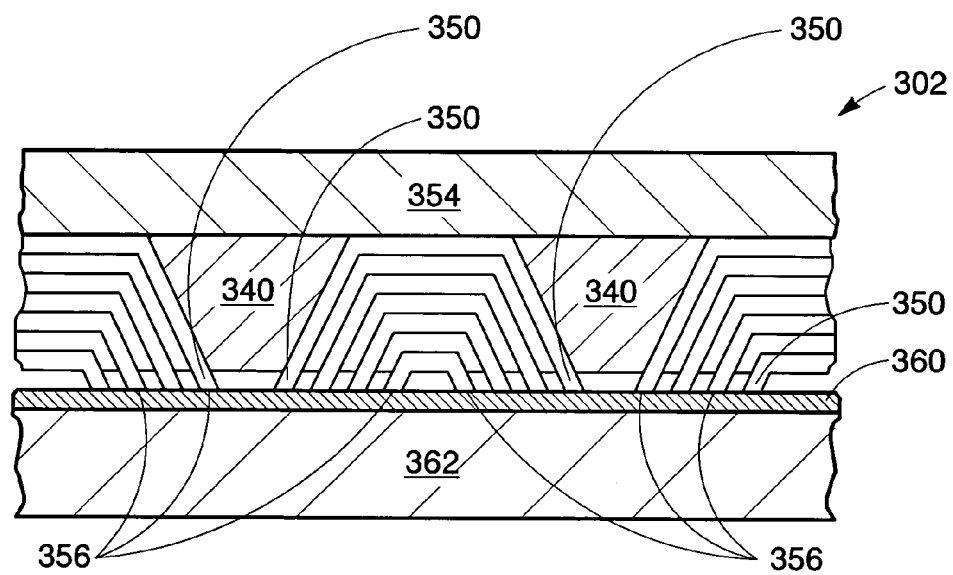
Figure 3C:
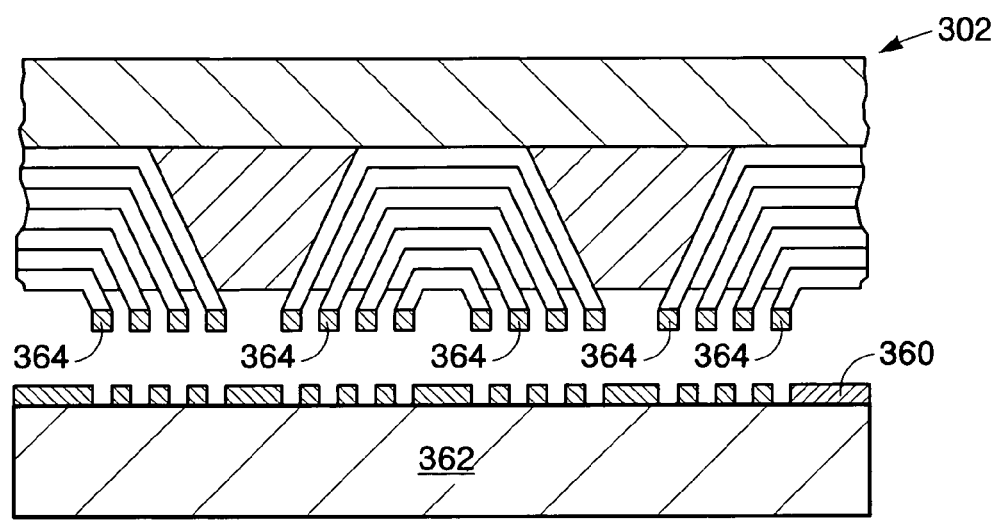
Figure 3D:
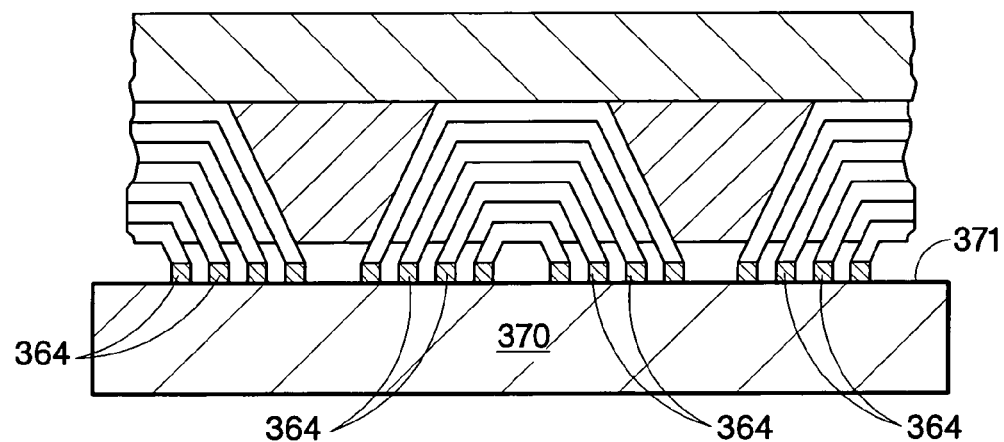
FIGS. 3d and 3e are cross-sectional views illustrating the transfer of material from the contact printing stamp shown in FIG. 3c to a receiving surface.
Figure 3E:
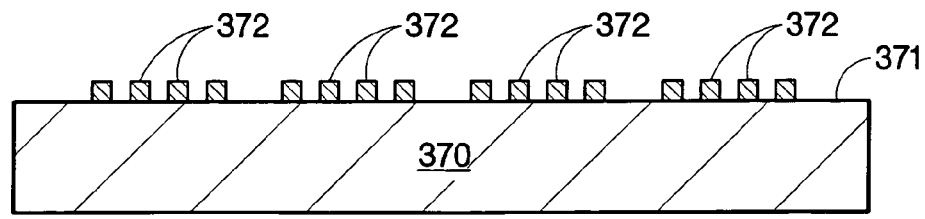

FIG. 3b, a cross-sectional view, illustrates the transfer or formation of material on contact printing stamp 302. The transfer, formation, or a combination of both, of a material or materials onto printing surface 356 of contact printing stamp 302 may be carried out using a wide variety of materials and techniques, as described earlier. In this embodiment, stamp 302 is placed in contact with or essentially in contact with transfer layer 360 as illustrated in FIG. 3b. After the desired transfer of sufficient material from transfer layer 360 has taken place, stamp 302 may then be pulled away or removed in some other manner from transfer layer 360 and transfer material support 362 as illustrated in a cross-sectional view in FIG. 3c. Contact printing stamp 302, along with stamp adherent material 364 transferred to and/or in contact with printing surface 356, may then be brought in contact with or essentially in contact with receiving surface 371 of receiving substrate 370 as illustrated in a cross-sectional view in FIG. 3d. After sufficient transfer of stamp adherent material 364 has taken place stamp 302 may then be separated, pulled away, or removed in some other manner from receiving surface 371 of receiving substrate 370. The material transferred from stamp 302 to receiving surface 371 forms patterned material 372 on receiving substrate 370 as illustrated in a cross-sectional view in FIG. 3e. Patterned material 372 and receiving substrate 370 may then undergo further processing to form a nanometer scale device.

Figure 4A:
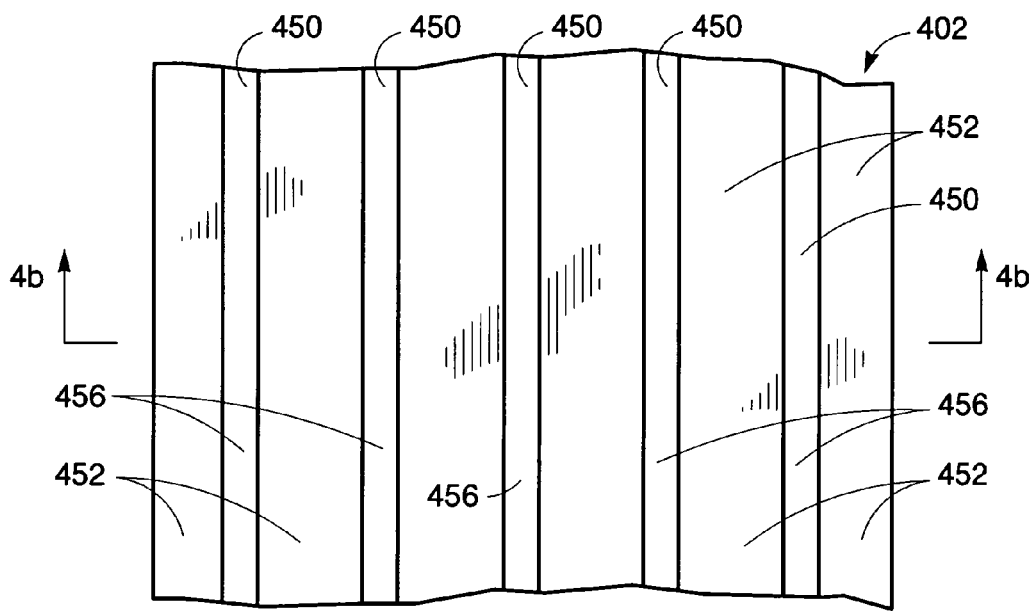
FIGS. 4a-4e are cross-sectional views illustrating a method of forming a pattern according to an alternate embodiment of the present invention.
Figure 4B:
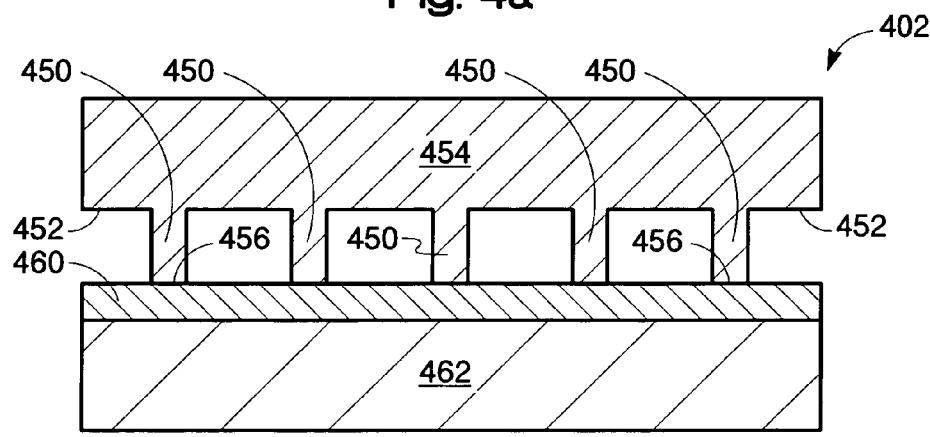
Figure 4C:
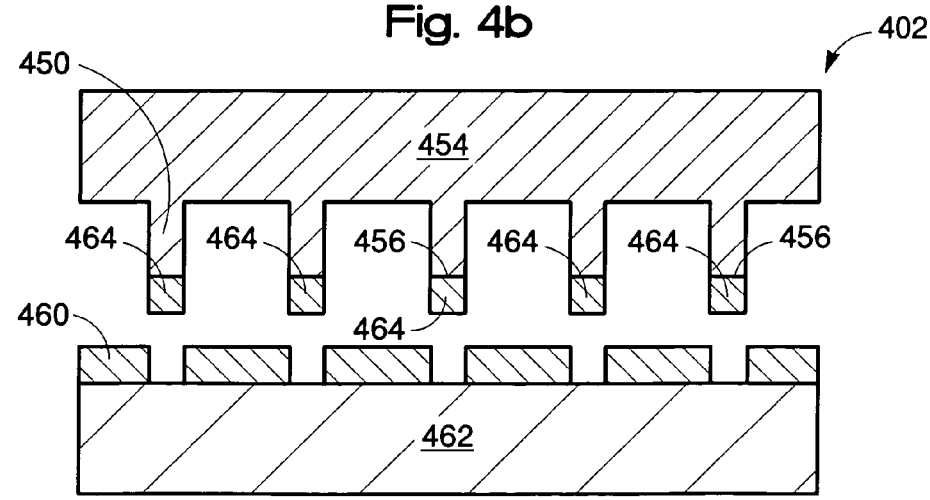

An alternate method of forming a pattern on a receiving surface is illustrated in cross-sectional views in FIGS. 4a-4e. In this embodiment, contact printing stamp 402 includes line protrusions 450 and corresponding line indentations 452. Line protrusions 450 form printing surfaces 456. FIGS. 4b and 4c, illustrate, the transfer of material onto contact printing stamp 402 similar to that described previously by placing printing surface 456 in contact with or essentially in contact with transfer layer 460 disposed on transfer material support 462 as shown in FIG. 4b. After the desired transfer of sufficient material from transfer layer 460 has taken place, stamp 402 may then be moved away from transfer layer 460 as illustrated in a cross-sectional view in FIG. 4c. In this embodiment, stamp adherent material 464 in FIG. 4c forms a line of adherent material having a length and width substantially the same as the length and width of protrusions 450 formed on stamp 402.

Figure 4D:
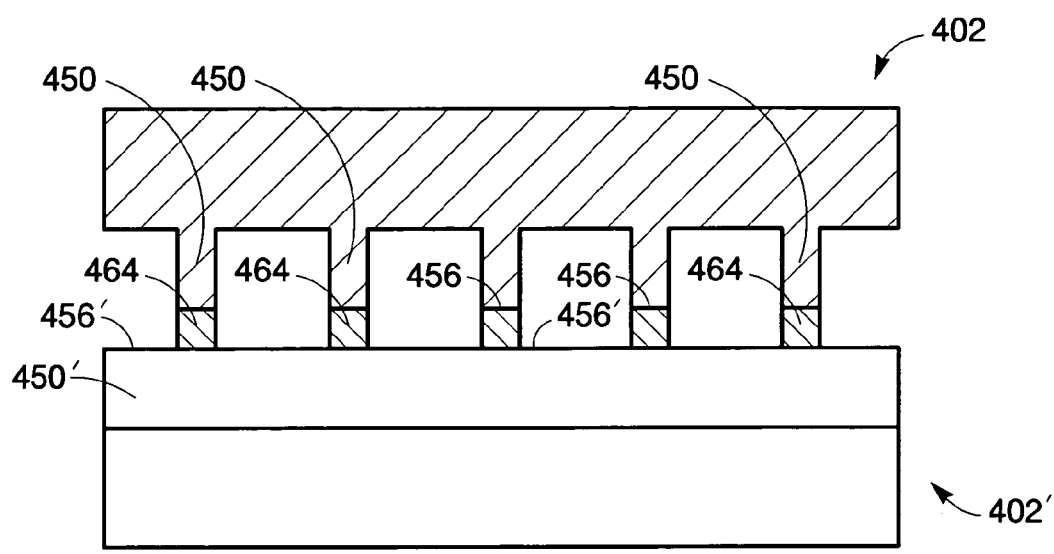
Figure 4E:
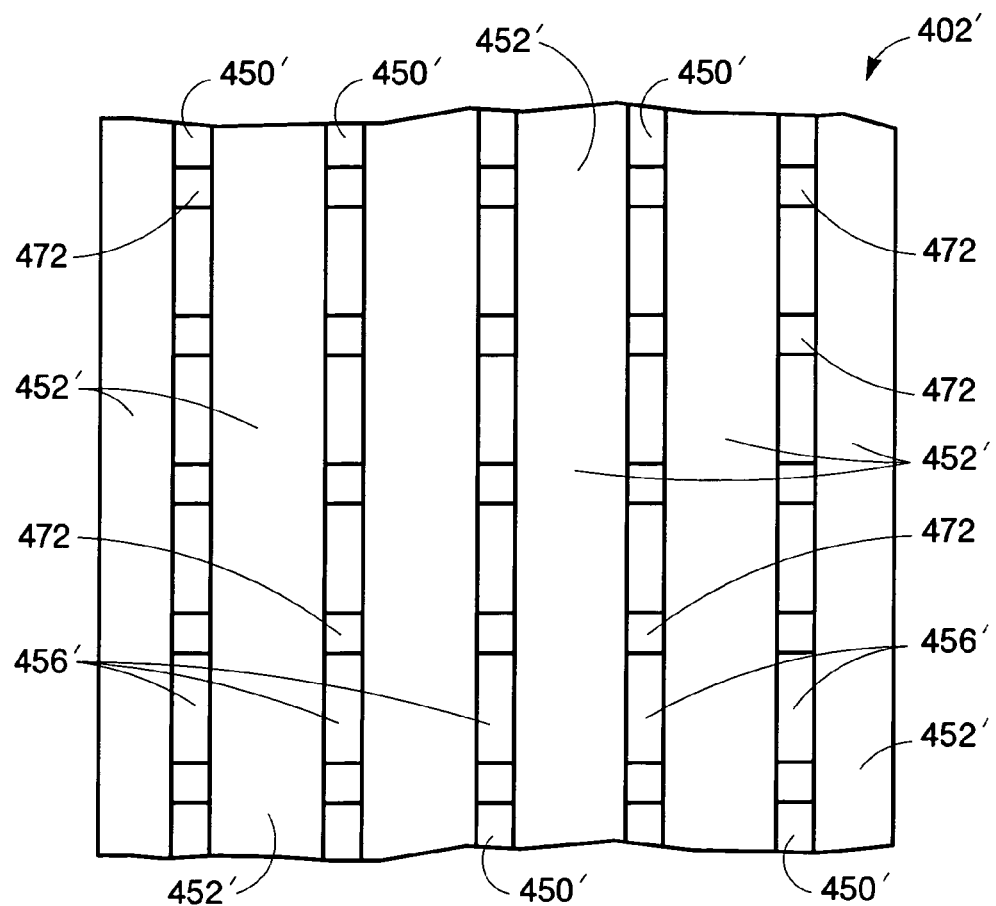

Contact printing stamp 402, along with the lines of stamp adherent material may then be brought in contact with or essentially in contact with second contact printing stamp 402' as illustrated in a cross-sectional view in FIG. 4d. In this embodiment, the receiving surface is printing surface 456' of line protrusions 450' disposed on printing stamp 402'. As illustrated in FIG. 4e line protrusions 450' form lines on stamp 402'. In this embodiment, before contact printing stamp 402 is brought in contact or essentially in contact with printing stamp 402' stamp 402 has been rotated by essentially 90 degrees. After sufficient transfer of stamp adherent material 464 has taken place, stamp 402 may then be pulled away, separated, or removed in some other manner, from printing stamp 402'. In this embodiment, the material transferred from stamp 402 to stamp 402' forms material regions 472 on line protrusions 450' as illustrated in a top plan view in FIG. 4e.

Material regions 472 can have nanometer scale dimensions or greater in all three dimensions as well as various combinations of nanometer dimensions and larger dimensions such as lines having a thickness of about 20 nanometers, a width of about 50 nanometers and a length of several hundred nanometers or even longer. Stamp 402' may then be brought in contact with, or essentially in contact with a receiving surface to transfer material regions 472 to the receiving surface. Although stamp 402 in this embodiment, was rotated 90 degrees, in alternate embodiments, a rotation anywhere from a few degrees to more than 90 degrees also may be utilized. This embodiment demonstrates the ability of using a contact printing stamp of the present invention to create a structure and/or pattern which is different from the pattern of the printing surface of the stamp.

An alternate method of forming a pattern of dots of material on a receiving surface is illustrated in isometric views in FIGS. 5a-5c. In this embodiment, multilayer thin film structure 500 is utilized as contact printing stamp 502 Contact printing stamp 502 includes first and second adjacent sides 530 and 532 that are planarized and at an angle 514. Contact printing stamp 502 also includes v-shaped protrusions 550 and indentations 552. The multilayer thin film structure utilized to form stamp 502 also includes alternating first material layer 522 and second material layers 526. V-shaped protrusions 550 are formed by selectively etching first material layers 522 of multilayer thin film structure 500. The thin knife edge end of protrusions 550, generated where first and second adjacent sides 530 and 532 meet, form printing surfaces 556. Contact printing stamp 502 also includes stamp indentations 552 corresponding to the depth to which first material layer was etched. FIGS. 5b and 5c, illustrate, the transfer of material onto contact printing stamp 502 and the subsequent transfer of the stamp adherent material to a receiving surface. In this embodiment printing surface 556 of stamp 502 is brought in contact with or essentially in contact with transfer layer 560 disposed on transfer material support 562 (not shown) and is similar to that described in previous embodiments. After the desired transfer of sufficient material from transfer layer 560 has taken place, stamp 502 may then be moved away from transfer layer 560 as shown in FIG. 5b. In this embodiment, stamp adherent material 564 in FIG. 5b forms an array of dots substantially the same size as the knife edge printing surface of protrusions 450 formed on stamp 402. Contact printing stamp 502 may then be brought in contact with or essentially in contact with a receiving surface of a receiving substrate and then removed or pulled away leaving an array of dots 572 formed on receiving surface 571 of receiving substrate 570 as illustrated in FIG. 5c. Dots 572 can have nanometer scale dimensions or greater in all three dimensions as well as various combinations of nanometer dimensions and larger dimensions such as lines having a thickness of about 20 nanometers, a width of about 50 nanometers and a length of several hundred nanometers or even longer.

Figure 5D:
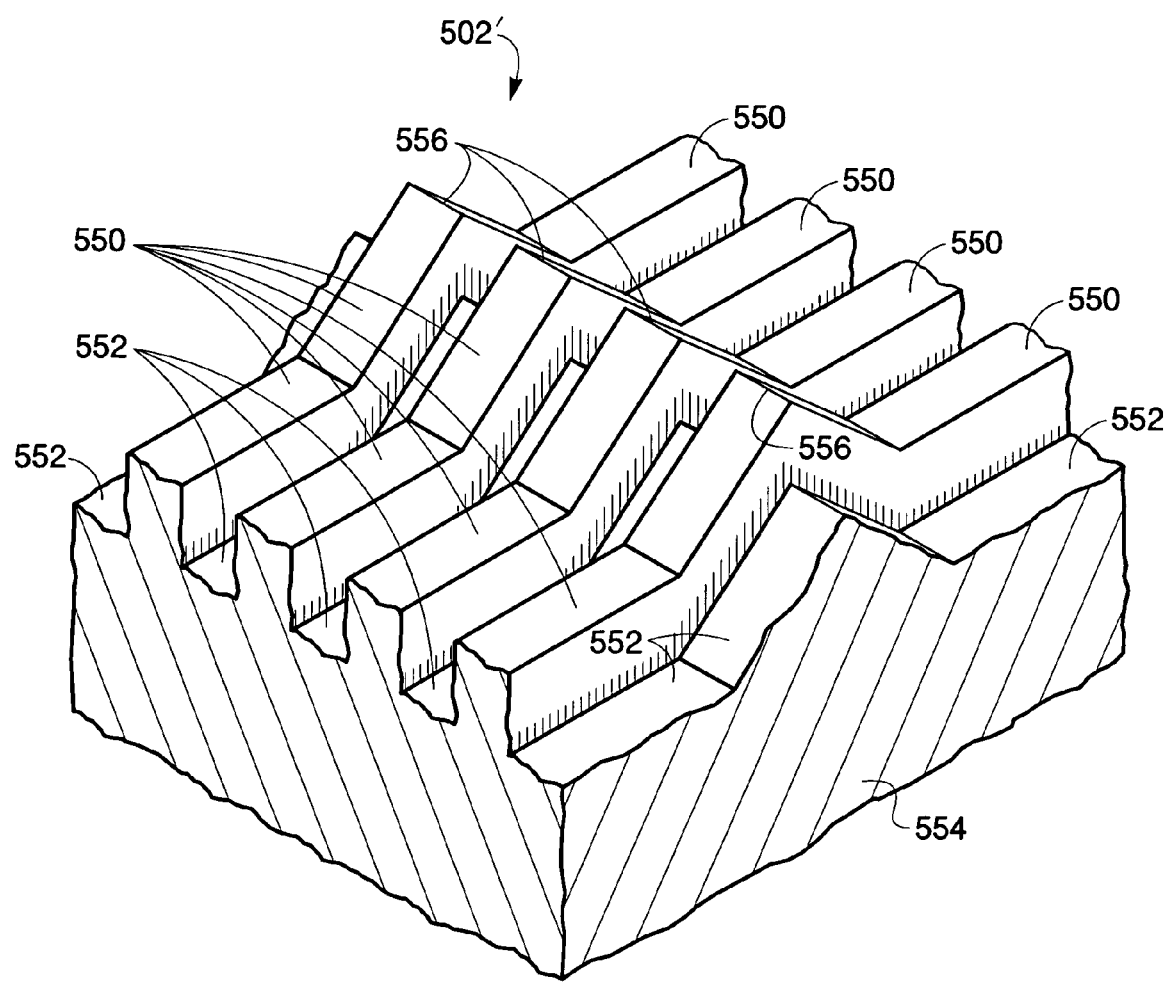
FIG. 5d is an isometric view of a contact printing stamp according to an alternate embodiment of the present invention.

An alternate embodiment of a contact printing stamp capable of producing an array of dots is shown in FIG. 5d. In this embodiment, contact printing stamp 502' is formed utilizing a multilayer thin film structure (not shown) that includes a v-shaped groove formed across alternating first and second material layers into the first and second material edges. Recessed regions are then formed in the alternating first and second material layers by selectively etching one of the layers. In this embodiment, the v-shaped groove is formed before the recessed regions are formed. By using such a multilayer thin film structure as a template or mold contact printing stamp 502' may be formed. An isometric view of contact printing stamp 502' after separation or removal from such a multilayer thin film structure is shown in an isometric view in FIG. 5d. Contact printing stamp 502' includes thin knife edge like protrusions 550' similar to protrusions 550 in the previous embodiment. In this embodiment, printing surface 556 is the thin knife edge of each protrusion formed at the apex of the complementary v-shaped groove formed in the multilayer thin film structure from which it is molded. Such a contact printing stamp also may be utilized to print arrays of nano-dots or even larger dots as described earlier.

What is claimed is:

1. A method of using a contact printing stamp, comprising: forming a transfer material on a plurality of stamping surfaces, said plurality of stamping surfaces disposed on a plurality of stamp protrusions adapted from the forming of a stamp material in a plurality of recessed regions, wherein said plurality of recessed regions are formed in an exposed end-region of a multilayer thin film structure.

2. The method in accordance with claim 1, further comprising transferring at least a portion of said transfer material onto a receiving surface to form a patterned material on said receiving surface.

3. The method in accordance with claim 2, wherein transferring at least said portion of said transfer material further comprises transferring a structure having at least one curved surface in a lateral direction.

4. The method in accordance with claim 2, wherein transferring at least said portion of said transfer material further comprises transferring at least two printing features connected to each other and intersecting at an acute angle in a lateral direction.

5. The method in accordance with claim 2, wherein transferring at least said portion of said transfer material further comprises transferring at least two characteristic features including two curved lines having a width, in a lateral dimension, less than about 80 nanometers.

6. The method in accordance with claim 5, wherein said two curved lines are co-parallel.

7. The method in accordance with claim 2, wherein transferring at least said portion of said transfer material further comprises transferring an array of dots of said transfer material.

8. The method in accordance with claim 7, wherein said array of dots further comprises said array of dots having at least one lateral dimension less than about 80 nanometers.

9. The method in accordance with claim 2, wherein said patterned material further comprises at least one feature having a curved surface in a lateral direction.

10. The method in accordance with claim 9, wherein said at least one feature includes at least one lateral dimension less than about 80 nanometers.

11. The method in accordance with claim 2, wherein said patterned material further comprises at least two features meeting at an acute angle in a lateral direction.

12. The method in accordance with claim 11, wherein said at least two features each include at least one lateral dimension less than about 80 nanometers.

13. The method in accordance with claim 2, wherein said patterned material further comprises at least two features meeting at a right angle in a lateral direction.

14. The method in accordance with claim 2, wherein transferring at least said portion of said transfer material further comprises transferring at least said portion of said transfer material onto a plurality of second stamping surfaces disposed on a plurality of second stamp protrusions of a second contact printing stamp to form a first pattern of said transfer material on said second contact printing stamp.

15. The method in accordance with claim 14, further comprising transferring at least a portion of said first pattern on said second contact printing stamp onto a second receiving surface to form a second pattern of said transfer material different from either said plurality of stamp protrusions or said plurality of second stamp protrusions.

16. The method in accordance with claim 14, further comprising rotating said second stamp protrusions through an angle relative to said plurality of stamp protrusions.

17. The method in accordance with claim 16, wherein said angle is less than or equal to 90 degrees.

18. The method in accordance with claim 2, wherein said patterned material further comprises at least two features meeting at an angle less than 180 degrees in a lateral direction.

19. The method in accordance with claim 18, wherein said at least two features each include at least one lateral dimension less than about 80 nanometers.

20. The method in accordance with claim 2, wherein said patterned material further comprises at least two curved features, wherein said two curved features are co-parallel.

21. The method in accordance with claim 1, wherein said plurality of stamp protrusions further comprises a plurality of knife-edge protrusions formed at the apex of a v-shaped structure.

22. The method in accordance with claim 21, wherein said plurality of knife-edge protrusions further comprises an array of dot-like printing surfaces.

23. The method in accordance with claim 21, wherein said patterned material further comprises an array of dot-like structures having at least one lateral dimension less than about 80 nanometers.

24. The method in accordance with claim 1, wherein said plurality of stamping protrusions further comprises said plurality of stamping protrusions disposed in said plurality of recessed regions formed in said exposed end-region of said multilayer thin film structure.

25. The method in accordance with claim 24, wherein an excess of said stamp material extends above a minor surface of said exposed end-region, said excess having a width substantially equal to a recessed region width.

26. The method in accordance with claim 25, wherein said plurality of stamping surfaces further comprises a plurality of planarized stamping surfaces.

27. The method in accordance with claim 1, wherein said plurality of stamping protrusions further comprises said plurality of stamping protrusions disposed in a plurality of chemically etched anodized metal recessed regions.

28. The method in accordance with claim 1, wherein said plurality of stamping protrusions further comprises said plurality of stamping protrusions disposed in a plurality of selectively etched recessed regions.

29. The method in accordance with claim 1, further comprising:
positioning said stamping surface over said receiving surface;
essentially contacting said receiving surface with said stamping surface; and
separating said stamping surface from said receiving surface.

30. The method in accordance with claim 1, wherein said stamping protrusions further comprises said stamping protrusions having at least one lateral dimension less than about 80 nanometers.

31. The method in accordance with claim 1, wherein adapted from the forming of said stamp material further comprises forming an excess of said stamp material extending above a minor surface of said exposed end-region, said excess having a width substantially equal to a recessed region width.

32. The method in accordance with claim 31, further comprising planarizing said excess of said stamp material.

33. The method in accordance with claim 32, further comprising planarizing said excess of said stamp material to at least said minor surface.

34. The method in accordance with claim 32, further comprising removing an exposed end portion of one or more layers of said multilayer thin film structure to a pre-selected depth below said minor surface, wherein stamp indentations are formed.

35. A curved line of transferred material formed by the method of claim 1.

36. Two lines of transferred material intersecting at an angle in a lateral dimension formed by the method of claim 1.

37. A structure of transferred material having curvature in a lateral dimension formed by the method of claim 1.

38. The method in accordance with claim 1, wherein forming said transfer material further comprises forming at least one alkane thiol, silane coupling agent, and mixtures thereof on said plurality of stamping surfaces.

39. The method in accordance with claim 1, wherein forming said transfer material further comprises forming a molecular recognition agent on said plurality of stamping surfaces.

40. The method in accordance with claim 39, wherein said molecular recognition agent includes at least one antibody, enzyme, protein, amino acid, aptamer, nucleic acid, molecular receptor, chelation compound, and mixtures thereof.

41. The method in accordance with claim 39, wherein said molecular recognition agent further comprises said molecular recognition agent conjugated with an intermediate attachment moiety.

42. The method in accordance with claim 37, wherein said intermediate attachment moiety includes at least one thiolated moiety, biotinylated moiety, and mixtures thereof.

43. A method of using an exposed end-region of a multilayer thin film structure as a contact printing stamp, comprising: forming a transfer material on a plurality of stamping surfaces, said plurality of stamping surfaces disposed on a plurality of stamp protrusions, wherein at least one stamp protrusion has either a printing feature having at least a portion forming a curved shape in at least one lateral dimension, or two printing features meeting at an angle less than 180 degrees in at least one lateral dimension, or both, wherein said plurality of stamp protrusions are formed in the exposed end-region.

44. The method in accordance with claim 43, further comprising transferring at least a portion of said transfer material onto a receiving surface.

45. The method in accordance with claim 43, wherein forming said transfer material further comprises forming a molecular recognition agent on said plurality of stamping surfaces.

46. The method in accordance with claim 43, wherein forming said transfer material on a plurality of stamping surfaces further comprises forming said transfer material on said plurality of stamping surfaces disposed on a plurality of thin knife edge protrusions formed in the exposed end-region.

47. A method of patterning a surface utilizing a contact printing stamp, comprising:
forming a transfer material on a stamping surface, said stamping surface having at least two indentations formed therein, said stamping surface having at least one lateral dimension less than about 80 nanometers and contiguous with said at least two indentations, said at least two indentations each having at least one lateral dimension less than about 80 nanometers;
positioning said stamping surface over a surface;
essentially contacting said surface with said stamping surface; and
removing said stamping surface from said surface, whereby at least a portion of said transfer material remains on said surface.

48. A method of patterning a surface, comprising:
forming a transfer material on a plurality of stamping surfaces, said plurality of stamping surfaces disposed on a plurality of stamp protrusions created by forming a stamp material in a plurality of recessed regions, wherein said plurality of recessed regions are formed in an exposed end-region of a multilayer thin film structure; and transferring at least a portion of said transfer material onto a receiving surface to form a patterned material on said receiving surface.

* * * * *